(12) United States Patent
Thallner

(10) Patent No.: US 7,910,454 B2
(45) Date of Patent: Mar. 22, 2011

(54) COMBINATION OF A SUBSTRATE AND A WAFER

(76) Inventor: Erich Thallner, Florian (AT)

( * ) Notice: Subject to any disclaimer, the term of this patent is extended or adjusted under 35 U.S.C. 154(b) by 1104 days.

(21) Appl. No.: 11/610,750

(22) Filed: Dec. 14, 2006

(65) Prior Publication Data

US 2007/0155129 A1    Jul. 5, 2007

(30) Foreign Application Priority Data

Jan. 3, 2006  (DE) .......................... 10 2006 000 687

(51) Int. Cl.
*H01L 21/30* (2006.01)
(52) U.S. Cl. ......... 438/455; 438/456; 438/458; 438/459
(58) Field of Classification Search .................. 438/455, 438/456, 458, 459
See application file for complete search history.

(56) References Cited

U.S. PATENT DOCUMENTS

| | | | |
|---|---|---|---|
| 6,090,687 A * | 7/2000 | Merchant et al. ............. | 438/455 |
| 6,462,415 B1 | 10/2002 | Ishiguri et al. ................ | 257/738 |
| 7,497,916 B2 * | 3/2009 | Hayashi et al. ................ | 156/64 |
| 2005/0236693 A1 | 10/2005 | Kroninger et al. ............ | 257/619 |

FOREIGN PATENT DOCUMENTS

| | | |
|---|---|---|
| DE | 103 40 409 | 4/2005 |
| DE | 102004018250 | 11/2005 |
| EP | 1 298 713 A1 | 4/2003 |
| JP | 2004193237 | 7/2004 |
| JP | 2005123382 | 5/2005 |

OTHER PUBLICATIONS

Austrian Search Report, Jan. 18, 2008.

* cited by examiner

*Primary Examiner* — David Vu
*Assistant Examiner* — Brandon Fox
(74) *Attorney, Agent, or Firm* — Kusner & Jaffe

(57) ABSTRACT

The invention pertains to a combination of a substrate (6) and a wafer (15), wherein the substrate (6) and the wafer (15) are arranged parallel to one another and bonded together with the aid of an adhesive layer (8) situated between the substrate (6) and the wafer (15), and wherein the adhesive is chosen such that its adhesive properties are neutralized or at least diminished when a predetermined temperature is exceeded. According to the invention, the adhesive layer (8) is only applied annularly between the substrate (6) and the wafer (15) in the edge region of the wafer (15).

28 Claims, 2 Drawing Sheets

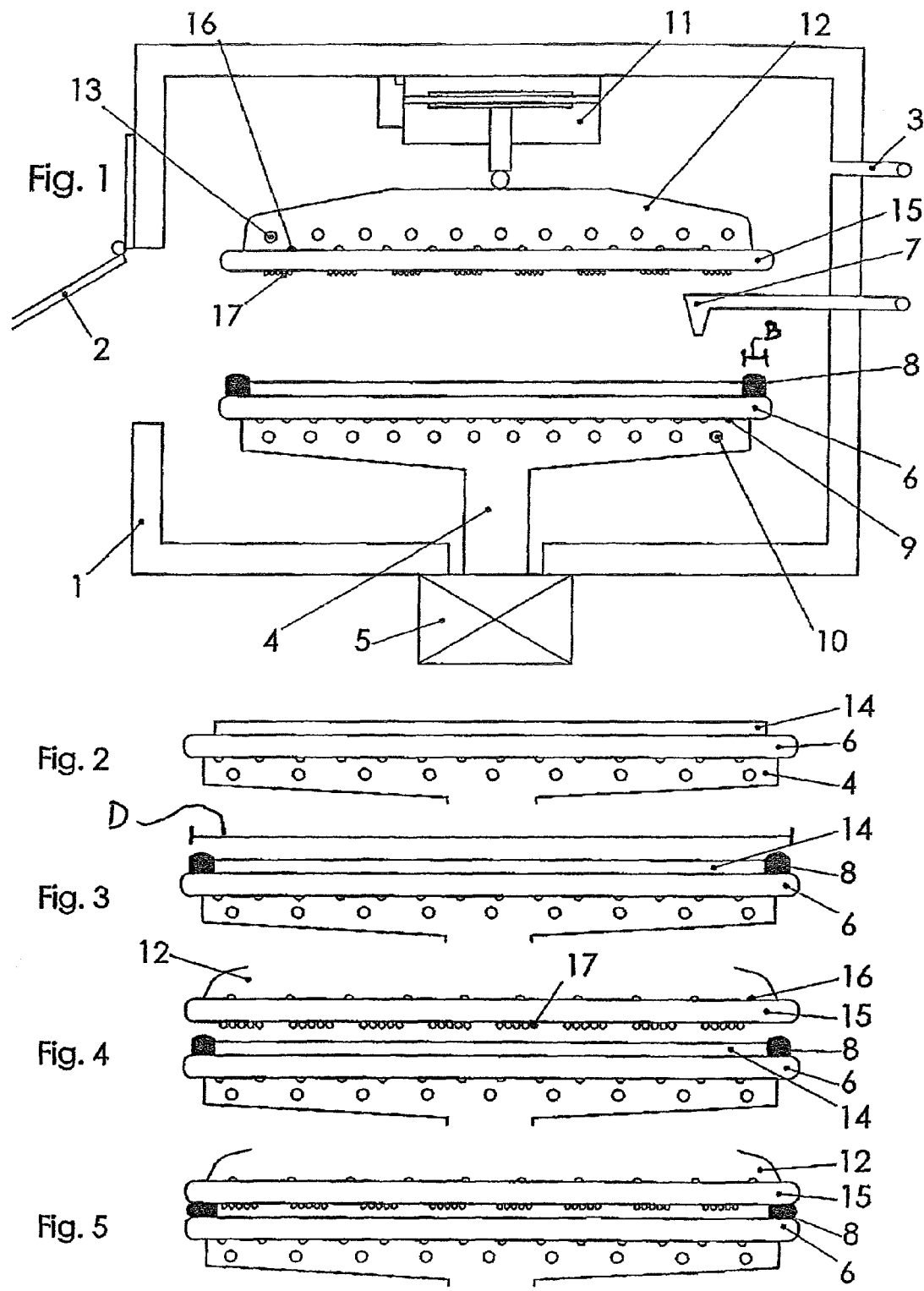

COMBINATION OF A SUBSTRATE AND A WAFER

FIELD OF THE INVENTION

The invention pertains to a combination of a substrate and a wafer, a device for separating a combination of a wafer and a substrate as well as a method for handling a substrate and a wafer.

BACKGROUND OF THE INVENTION

In the semiconductor industry, it is necessary to subject a wafer to a rethinning process after its structuring in order to reduce the axial or vertical dimensions and to realize electrical and thermal improvements of the finished product. In the rethinning process, the non-structured side of the wafer is removed by means of mechanical grinding methods. The electrically active layer and, if applicable, any contacting terminals provided on the wafer surface that are usually realized in the form of small soldering globules (pumps) remain untouched.

Since the rethinning process is usually realized by grinding the wafer mechanically as mentioned above, it is necessary to fix the wafer on a stable substrate in order to stabilize the wafer during the grinding process. This type of stabilization is particularly important for an already rethinned wafer because a wafer of this type only has a very slight mechanical stability.

In order to increase the mechanical stability of the wafer, it needs to be initially fixed on a substrate. However, the substrate needs to be removed again after the rethinning process is completed, namely without damaging the sensitive rethinned wafer during this process.

Numerous methods and devices are used in practical applications for producing this temporary connection between a wafer and a substrate. In all these methods, it is attempted to reuse the substrate for cost reasons. If silicone is used as the base material for the electric circuits, a silicon wafer is also used as the substrate in practical applications due to the favorable costs and the identical coefficient of thermal expansion. Substrates of glass, sapphire or other materials are used if the wafers consist of a different material, for example, GaAs.

One widely used method for fixing a wafer on a glass substrate consists of bonding the glass substrate to the wafer over a large surface. The adhesive used has the peculiar property of losing its adhesive properties once a certain temperature is exceeded. In order to separate the wafer from the glass substrate, energy is applied to the glass wafer by means of a laser such that the adhesive is dissolved. The wafer and the glass substrate can then be easily separated from one another. The disadvantage of this known method in practical applications can be seen in that the adhesive frequently is already destroyed by the temperatures occurring during the rethinning process such that the wafer already separates from its substrate during the rethinning process. This results in the destruction of the wafers.

Other known methods utilize films that are provided with an adhesive layer. This adhesive also loses its adhesive properties when a certain temperature is exceeded. Analogous to the previously described method, the high temperatures occurring during the rethinning process may already cause the connection between the substrate and the wafer to separate.

Adhesives that only lose their adhesive properties at temperatures higher than those occurring during the rethinning process cannot be used because the temperatures required for neutralizing the adhesive would destroy the structures of the wafer.

SUMMARY OF THE INVENTION

The invention is based on the objective of proposing a combination of a substrate and a wafer, in which the connection between the substrate and the wafer withstands the temperatures occurring during a rethinning process without damages and can be separated with simple means after the rethinning process is completed without damaging the structured wafer. Other objectives of the invention consist of proposing a device for separating the combination of a wafer and a substrate, as well as a method for handling a wafer and a substrate.

This objective is attained with a combination of a substrate and a wafer with the characteristics of claim 1. With respect to the device, the objective is attained with the characteristics of claim 6. A procedural solution is disclosed in claim 10. Advantageous additional developments of the invention are disclosed in the dependent claims.

The invention is based on the concept of only applying the adhesive annularly in the edge region between the wafer and the substrate rather than over a large surface therebetween. This means that the adhesive is situated in a region of the wafer that usually does not contain any structures. This makes it possible to utilize adhesives that only lose their adhesive or bonding properties at substantially higher temperatures than those occurring during the rethinning process. The adhesive used may not lose its adhesive properties until the temperature exceeds approximately 400° C., namely without destroying the already existing circuits and contacts. In this case, only the annular edge region needs to be heated in order to separate the combination of the substrate and the wafer such that structures in the region within the annular adhesive layer are not heated or at least not excessively heated and therefore tolerate the separation process without damages. Suitable adhesives are based on polymers or epoxy resins.

A particularly sound connection between the substrate and the wafer is produced if a closed ring of adhesive is applied along the circumference. Since wafers usually consist of circular structures, it is advantageous to apply the adhesive annularly so as to optimally utilize the available adhesive surface. The width B of the annular adhesive layer is preferably small in relation to the diameter D of the adhesive layer. The width B typically lies between 2 mm and no more than 5 mm.

In the rethinning of wafers that are already provided with contacting terminals, particularly pumps, it is important to mechanically support the regions of the wafer that are not fitted with contacting terminals because fluctuations in thickness may otherwise occur during the rethinning process due to the deformation of the crystalline structure of the wafer. The invention therefore proposes to provide an elastic film in the region enclosed by the annular adhesive layer. The contacting terminals protrude into the elastic film and are enclosed thereby. The regions without contacting terminals are mechanically supported such that the wafer cannot deflect during the rethinning process.

According to an additional development of the invention, it may be advantageous to use elastic films that are provided with an adhesive layer on one or both sides in order to additionally improve the adhesion between the substrate and the wafer. However, this adhesive layer should already lose its adhesive properties at lower temperatures than the annular adhesive layer in the outer region because excessively high temperatures would otherwise be required in order to separate the film and these temperatures could already lead to damages of the structured wafer. However, no problems arise if the adhesive layer of the film already dissolves during the rethinning process because the substrate and the wafer remain fixed to one another by means of the annular adhesive layer.

Another subject of the invention consists of a device for separating the inventive combination of a wafer and a substrate. In this respect, it is decisive that the substrate and the wafer are separated by heating only the region of the combination of the substrate and the wafer that is provided with the annular adhesive layer. According to the invention, the heating of this edge region is realized with a heating element, the axial annular heating section of which protrudes in the direction of the substrate. In this case, the diameter and the width of the heating section at least approximately correspond to the diameter and the width of the annular adhesive layer. An adjusting device is furthermore provided in order to adjust the heating element relative to the combination of a wafer and a substrate. Since the wafer usually lies on the substrate, it is advantageous that the heating element can be adjusted perpendicular to the combination of the substrate and the wafer.

In order to ensure that the wafer can be lifted off the substrate after the adhesive layer is neutralized, an additional development of the invention proposes to provide a fixing device for fixing the wafer within the annular heating section. This fixing device preferably consists of a vacuum-based device and holds the wafer by means of suction.

In order to ensure that the annular heating section can be lifted off the wafer despite the wafer being fixed on the fixing device, an advantageous additional development of the invention proposes that the annular heating section and the fixing device can be adjusted relative to one another in the axial direction. The annular heating section can be adjusted, in particular, away from the wafer in the axial direction when the wafer is fixed on the fixing device.

According to one solution for realizing the relative adjustability between the annular heating section and the fixing device that is particularly advantageous with respect to constructive considerations, the fixing device is suspended on the heating element or another structural element of the device by means of at least one spring. When the heating element is displaced upward together with its annular heating section, the fixing device expands the springs such that the wafer is suspended on the fixing device a certain distance from the annular heating section.

Another subject of the invention consists of a method for handling a substrate and a wafer. The wafer is fixed on the substrate by applying an adhesive layer on the substrate and/or the wafer. It is advantageous to apply the adhesive layer on the substrate fixed on the fixing device. According to the invention, it is proposed to apply the adhesive layer annularly. The diameter of the annular adhesive layer should have such dimensions that it is situated between the substrate and the wafer in the edge region of the latter. The outside diameter of the adhesive layer approximately corresponds to the diameter of the wafer.

In substrates with contacting terminals, it is advantageous to apply an elastic film on the substrate in the region within the annular adhesive layer before the wafer is connected to the substrate, wherein the contacting terminals are able to protrude into this elastic film. In order to realize a thin adhesive layer, it is advantageous to set the substrate and/or the wafer in rotation before they are connected, namely in dependence on which component carries the adhesive layer. Part of the applied adhesive can be thrown outward due to this measure.

The adhesive layer needs to harden after the wafer and the substrate are connected. It is advantageous to utilize an adhesive that can be hardened by means of heating. However, it would also be possible to use, for example, UF-hardening adhesives.

According to an additional development of the invention, the wafer and the substrate are separated by heating the annular adhesive layer to a predetermined temperature. At this temperature, the adhesive loses its adhesive properties such that the wafer can be separated from the substrate. It should be observed that only the region of the annular adhesive layer is heated so as to avoid damaging the structures of the wafer. A heating element with an annular heating section is particularly suitable for heating the adhesive layer.

Other advantages and practical embodiments are disclosed in the remaining claims, the description of the figures and the drawings.

BRIEF DESCRIPTION OF THE DRAWINGS

In these drawings:

FIG. 1 shows a device for connecting a wafer to a substrate;

FIG. 2 shows a substrate with a film applied thereto that is fixed on a fixing device;

FIG. 3 shows the substrate according to FIG. 2 with an adhesive layer annularly applied thereon;

FIG. 4 shows a wafer held on a receptacle device shortly before it is connected to the substrate featuring the annular adhesive layer and the film;

FIG. 5 shows a combination of a substrate and a wafer in which the substrate is held on a receptacle device and the wafer is held on a fixing device;

DETAILED DESCRIPTION OF PREFERRED EMBODIMENT

Figure 6:
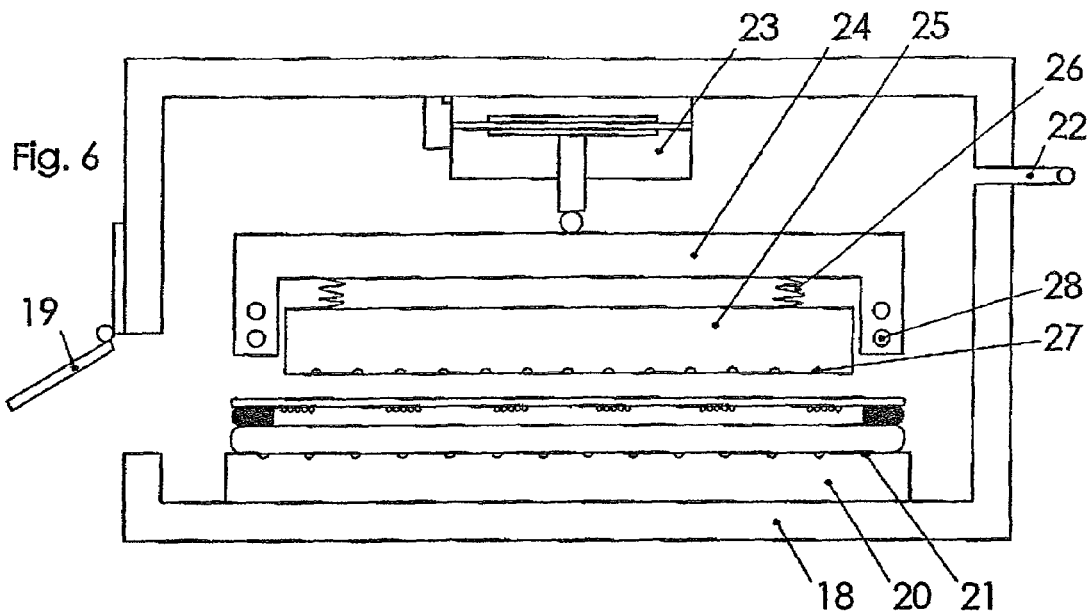
FIG. 6 shows a device for separating the combination of a wafer and a substrate.

In the figures, identical components and components with identical functions are identified by the same reference symbol.

FIG. 1 shows a device for connecting a wafer 15 with a substrate 6. The device comprises a chamber 1 with a cover 2. The cover 2 serves for tightly closing the chamber 1 relative to the surroundings. The cover 2 simultaneously serves for loading the chamber 1 with the substrate 6 and the wafer 15. The chamber 1 can be evacuated by means of a not-shown vacuum pump and a vacuum line 3 so as to prevent air inclusions when the connection between the substrate 6 and the wafer 15 is produced.

A receptacle device 4 (chuck) for accommodating the substrate 6 is provided within the chamber 1. The receptacle device is connected to a motor unit 5. The receptacle device 4 can be set in rotation by means of the motor unit 5.

The device furthermore comprises an adjustable nozzle 7 for applying the fluid adhesive on the substrate 6. Suitable adhesives are based on polymers or epoxy resins. The receptacle device 4 rotates while as the adhesive is ejected from the nozzle 7 such that the adhesive is applied in the form of an annular adhesive layer 8 in the edge region between the substrate 6 and the wafer 15.

Vacuum grooves 9 are arranged in the surface of the receptacle device 4 in order to prevent the substrate 6 from shifting during the rotation of the receptacle device 4, wherein these vacuum grooves make it possible to fix the substrate 6, in this case also a wafer, on the receptacle device 4. The receptacle device 4 furthermore features a helical heating element 10 in order to quickly harden the adhesive layer 8 that has an annular shape in this case. In the embodiment shown, the helical heating elements are distributed over the entire surface of the receptacle device 4 because an adhesive film 14, the adhesive of which is also hardened, is additionally utilized in this case as described in detail below. The adhesive of the film is hardened with the aid of the helical heating element 10. However, the film 14 can also be omitted, particularly if the wafers do not contain any contacting terminals 17. The vacuum connection of the vacuum grooves 9 as well as the electrical connections leading to the helical heating elements 10 are not illustrated in the figure.

In addition, a lifting device 11 is provided in the chamber 1 in order to adjust a fixing device 12 vertically in the direction of the receptacle device 4. Additional helical heating elements 13 are integrated into the fixing device 12 in order to maintain the fixing device 12 and therefore the wafer 15 at a certain temperature. The required temperature sensors and electrical connections of the helical heating element(s) 13, as well as a control device coupled to the temperature sensors, are not illustrated in this figure.

FIG. 2 shows the receptacle device 4 with the substrate 6 that lies and is fixed thereon. The aforementioned elastically deformable film 14 is placed on the substrate 6. In this embodiment, both sides of the film 14 are provided with an adhesive layer in order to enable the substrate 6 to adhere to the wafer 15. As mentioned above, it is not absolutely imperative to provide this adhesive layer.

The substrate 6 is introduced into the chamber 1 by means of a not-shown robot (arm) while the cover 2 is opened, wherein the substrate is placed on the receptacle device 4 and fixed thereon with the aid of the vacuum grooves 9.

In FIG. 3, an annular adhesive layer 8 is already applied in the edge region. The fluid adhesive is ejected from the nozzle shown in FIG. 7 that needs to be moved radially outward from the position shown for this purpose. In order to produce the annular adhesive layer 8, the receptacle device 4 needs to be set in rotation by means of the motor unit 5. The applied adhesive layer can be partially thrown off by increasing the rotational speed such that a very thin adhesive layer 8 is produced.

In FIG. 4, the wafer 15 is fixed on the fixing device 12 and held thereon by means of vacuum grooves 16. The fixing device 12 with the wafer 15 fixed thereon is arranged a certain distance from the substrate 6 featuring the film 14. In this state, the cover 2 is closed and the chamber 1 is evacuated via the vacuum line 3. The fixing device 12 is promptly displaced in the direction of the receptacle device for accommodating the substrate 6 by means of the lifting device 11 and pressed against the substrate with a predetermined pressing force. During this process, contacting terminals 17 provided on the wafer 15 are pressed into the elastic film 14 and enclosed thereby. The dispensed adhesive layer 8 is simultaneously compressed between the wafer 15 and the substrate 6. The adhesive layer 8 is hardened with the aid of the helical heating elements 10 and 13.

In FIG. 5, the substrate 6 and the wafer 15 already are rigidly connected to one another. The combination of the substrate 6 and the wafer 15 is removed by means of a robot after the cover 2 is opened and delivered to a rethinning process. After the rethinning process, the substrate 6 and the wafer 15 need to be separated from one another without destroying the wafer 15 or the substrate 6. The substrate 6 is reused after this separation process.

FIG. 6 shows a separating device for separating the wafer 15 from the substrate 6 that features a separating chamber 18. The separating chamber 18 is provided with a cover 19 for loading the combination of the substrate 6 and the wafer 15 into the separating chamber 18 by means of a not-shown robot. The separating chamber 18 can be evacuated by means of a not-shown vacuum pump and the corresponding vacuum line 22 in order to create a vacuum or gas atmosphere. A fixing device 20 is provided within the separating chamber 18 in order to fix the substrate with the aid of vacuum grooves 21. A lifting device 23 is also provided in the separating chamber 18. A trough-shaped heating element 24 is fixed on the lifting device 23. The heating element 24 features an annular heating section with helical heating elements 28, wherein the annular heating section (circumferential wall of the trough) extends axially in the direction of the fixing device 20 with the substrate 6 and the rethinned wafer 15. A fixing device 25 that is not heated and features vacuum grooves 27 for fixing the wafer 15 is arranged radially within the annular heating section. In the embodiment shown, the fixing device 25 has a circular cross-sectional surface. The fixing device 25 is suspended on the heating element 24 with the aid of springs 26 that limit the displacement of the fixing device. The annular heating section and the fixing device 25 can be axially moved relative to one another due to this measure. The width of the annular heating section approximately corresponds to the width of the adhesive layer 8.

The annular heating section is heated to a predetermined temperature with the aid of the helical heating elements 28. The temperature is chosen such that the adhesive layer 8 dissolves or the adhesive properties of the adhesive used are diminished or neutralized. The electrical connections and the required temperature sensors and control lines, as well as the control devices for adjusting the temperature of the annular heating section, are not illustrated in the figure.

Figure 7:
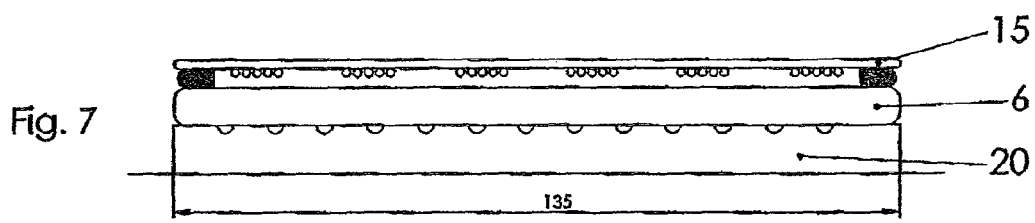
FIG. 7 shows a combination of a substrate and a wafer in which the substrate is held on a fixing device.
Figure 8:
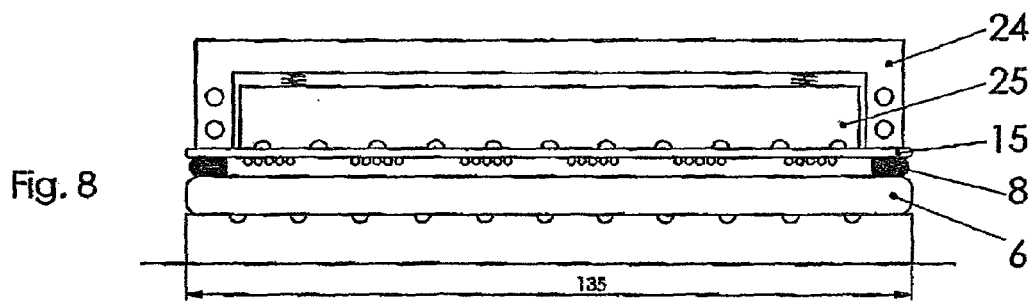
FIG. 8 shows an intermediate step during the separation of the combination of a substrate and a wafer, in which a heating element with an annular heating section is lowered on the wafer and a fixing device that is suspended on the heating element by means of springs is situated in the region within the annular heating section.

FIG. 7 shows the combination of the substrate 6 and the wafer 15 in the position in which they are deposited on the fixing device 20 by means of a robot. The substrate 6 is fixed in position by means of a vacuum applied via the vacuum grooves 21. Subsequently, the lifting device lowers the heating element 24 on the wafer 15 together with the fixing device 20. The lowered position is illustrated in FIG. 8. Since only the annular heating section is heated with the aid of the helical heating elements 28 and the fixing device 25 remains unheated, heat is only supplied to the edge region of the rethinned wafer 15 in order to neutralize the adhesive properties of the adhesive. The wafer 15 is not damaged because the remaining region of the wafer 15, i.e., the region within the annular adhesive layer 8, is not heated or not heated as intensely as the edge region. This means that adhesives can be used that only lose their adhesive properties at very high temperatures.

Figure 9:
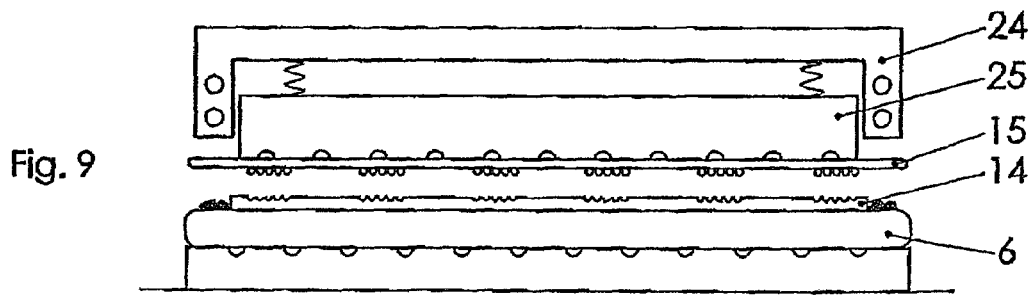
FIG. 9 shows the heating element that can be displaced relative to the fixing device, as well as the wafer that is lifted off the substrate and fixed thereon.

After an adjustable time period that is required for neutralizing the adhesive properties of the adhesive under the influence of heat, the rethinned wafer 15 held on the fixing device 25 with the aid of the vacuum grooves 27 is lifted off. This lifting process is illustrated in FIG. 9. This figure shows that the heating element 24 is lifted before the fixing device 25. This is caused by the spring suspension. Due to the springs 26, the heating element 24 with its annular heating section 24 is displaced axially relative to the fixing device 25 such that the wafer 15 is held on the fixing device 25 a certain distance from the annular heating section. The rethinned wafer 15 and the substrate 6 are now removed through the opened cover 19 by means of a robot.

If the wafer 15 does not contain any contacting terminals 17, the elastic film 14 can be omitted. In this case, the annular adhesive layer 8 is largely thrown off due to the high-speed rotation of the receptacle device 4 such that a very thin adhesive layer 8 is produced.

It would also be conceivable to omit the process of lifting off the wafer with the aid of the fixing device 25. It is possible to completely remove the combination of the substrate 6 and the wafer 15 by means of the annular heating section after the neutralization of the adhesive layer 8 and the transport of this combination to a laminating station, in which the additional processing takes place. The rethinned wafer 15 is fixed on a carrier film in this station.

The invention claimed is:

1. A method for handling a substrate (6) and a wafer (15), the method comprising the steps of: applying an adhesive layer (8) on the substrate and/or wafer (15); temporarily bonding the wafer (15) on the substrate (6), wherein the adhesive layer (8) is applied in such a way that the adhesive layer (8) is disposed only annularly between the substrate (6) and the wafer (15) in the edge region of the wafer (15), and in that the wafer (15) is applied on the substrate (6); and separating the wafer (15) from the substrate (6).

2. The method according to claim 1, further comprising the step of:
applying a film (14) in the region situated within the annular adhesive layer (8) before the wafer (15) is placed on the substrate (6).

3. The method according to claim 1, further comprising the step of:
rotating the substrate (6) and/or the wafer to throw off part of the applied adhesive layer (8).

4. The method according to claim 1, further comprising the step of:
hardening the annular adhesive layer (8).

5. The method according to claim 4, wherein the annular adhesive layer (8) is hardened by heating the annular adhesive layer (8).

6. The method according to claim 1, wherein the step of separating the wafer from the substrate includes heating the annular adhesive layer (8) to a predetermined temperature.

7. The method according to claim 6, wherein the wafer (15) and/or the substrate (6) are heated only in the region of the adhesive layer (8).

8. The method according to claim 7, wherein a heating element (24) with an annular heating section heats the wafer (15) and/or the substrate (6).

9. The method according to claim 1, wherein the wafer is mounted on a carrier film after rethinning the wafer and before separating the wafer and the substrate.

10. A method for handling a substrate (6) and a wafer (15), the method comprising the steps of:
applying an adhesive layer (8) on the substrate (6) and/or the wafer (15);
fixing the wafer (15) on the substrate (6), wherein the adhesive layer (8) is applied in such a way that the adhesive layer (8) is disposed only annularly between the substrate (6) and the wafer (15) in the edge region of the wafer (15), and in that the wafer (15) is applied on the substrate (6); and
heating the annular adhesive layer (8) to a predetermined temperature in order to separate the wafer (15) from the substrate (6).

11. The method according to claim 10, wherein the wafer (15) and/or the substrate (6) are heated only in the region of the adhesive layer (8).

12. The method according to claim 11, wherein a heating element (24) with an annular heating section heats the wafer (15) and/or the substrate (6).

13. A method for handling a substrate and a wafer, the method comprising the steps of:
applying an adhesive layer on the substrate and/or the wafer,
wherein the adhesive layer is applied in the annular edge region of the substrate and/or the wafer,
temporarily bonding the wafer to the substrate,
wherein only the annular edge region needs to be treated to reduce the adhesion of the adhesive layer in order to separate the substrate and the wafer.

14. The method according to claim 13, wherein the wafer is mounted on a carrier film after rethinning the wafer and before separating the wafer and the substrate.

15. The method according to claim 13, wherein the width of the annular adhesive layer lies between 2 mm and 5 mm.

16. The method according to claim 13, further comprising the steps of:
treating only the annular edge region of the substrate to reduce the adhesion of the adhesive layer, and
separating the substrate and the wafer.

17. A method for handling a substrate and a wafer, the method comprising the steps of: applying an adhesive layer on the substrate and/or wafer, wherein the adhesive layer is applied in the annular edge region of the substrate and/or the wafer, providing a film in a region situated within the annular adhesive layer to mechanically support the wafer, temporarily bonding the wafer to the substrate, treating only the annular edge region of the substrate to reduce the adhesion of the adhesive layer, and separating the substrate and the wafer.

18. The method according to claim 17, wherein the film is provided with an adhesive layer on one or both sides.

19. The method according to claim 17, wherein the wafer is mounted on a carrier film after rethinning of the wafer and before separating the wafer and the substrate.

20. The method according to claim 17, wherein the width B of the annular adhesive layer lies between 2 mm and 5 mm.

21. A method for handling a substrate and a wafer, the method comprising the steps of:
providing an adhesive,
applying the adhesive in a layer on the substrate and/or the wafer, the adhesive layer being applied in the annular edge region of the substrate and/or the wafer, and
temporarily bonding the wafer to the substrate,
wherein the foregoing steps are performed such that treatment of only the annular edge region of the substrate is required to reduce the adhesion of the adhesive layer in order to separate the substrate and the wafer.

22. A method for preparing a substrate for temporarily bonding to a wafer, the method comprising the steps of:
providing a substrate,
providing an adhesive,
applying the adhesive in a layer on the substrate, the adhesive layer being applied in the annular edge region of the substrate, and
providing a film in a region situated within the annular adhesive layer to mechanically support a wafer,
wherein the foregoing steps are performed in a manner such that the substrate is thereby configured to temporarily bond to a wafer and configured so that a treatment of only the annular edge region of the substrate is required to reduce the adhesion of the adhesive layer in order to separate the substrate and the wafer.

23. A method in accordance with claim 22, wherein:
the step of providing a substrate includes providing a substrate formed from a material selected from the group consisting of silicon, glass, and sapphire, and
the step of providing an adhesive includes providing an adhesive suitable for temporarily bonding a silicon or a gallium arsenide wafer to the substrate.

24. A method in accordance with claim 23, wherein:
the step of providing an adhesive includes providing a polymer or epoxy adhesive.

25. A method in accordance with claim 24, further comprising the steps of:
providing a wafer of semiconductor material, and
temporarily bonding the wafer to the substrate.

26. A method in accordance with claim 25, further comprising the step of separating the substrate and the wafer.

27. A method in accordance with claim 26, further comprising the step of treating only the annular edge region of the substrate to reduce the adhesion of the adhesive layer prior to separating the substrate and the wafer.

28. A method in accordance with claim 25, further comprising the steps of:
rethinning the wafer,
mounting the wafer on a carrier film after rethinning of the wafer, and
separating the wafer and the substrate after mounting the wafer on a carrier film.

* * * * *

UNITED STATES PATENT AND TRADEMARK OFFICE
CERTIFICATE OF CORRECTION

PATENT NO. : 7,910,454 B2  
APPLICATION NO. : 11/610750  
DATED : March 22, 2011  
INVENTOR(S) : Erich Thallner Page 1 of 1

It is certified that error appears in the above-identified patent and that said Letters Patent is hereby corrected as shown below:

On title page, item 76 Inventor,  
replace "Florian"  
with "St. Florian"

Signed and Sealed this  
Tenth Day of May, 2011

David J. Kappos  
*Director of the United States Patent and Trademark Office*